United States Patent
Roque et al.

(10) Patent No.: US 9,478,394 B2
(45) Date of Patent: Oct. 25, 2016

(54) METHOD FOR INCREASED TARGET UTILIZATION IN ION BEAM DEPOSITION TOOLS

(71) Applicants: Mario B. Roque, Plainview, NY (US);
Victor L. Castro, Melville, NY (US);
Hector J. Castillo, Mastic, NY (US)

(72) Inventors: Mario B. Roque, Plainview, NY (US);
Victor L. Castro, Melville, NY (US);
Hector J. Castillo, Mastic, NY (US)

(73) Assignee: Veeco Instruments, Inc., Plainview, NY (US)

( * ) Notice: Subject to any disclaimer, the term of this patent is extended or adjusted under 35 U.S.C. 154(b) by 0 days.

(21) Appl. No.: 14/643,371

(22) Filed: Mar. 10, 2015

(65) Prior Publication Data

US 2015/0262789 A1    Sep. 17, 2015

Related U.S. Application Data

(60) Provisional application No. 61/951,192, filed on Mar. 11, 2014.

(51) Int. Cl.
| | |
|---|---|
| *C23C 14/46* | (2006.01) |
| *H01J 37/30* | (2006.01) |
| *H01J 37/34* | (2006.01) |
| *C23C 14/34* | (2006.01) |

(52) U.S. Cl.
CPC ....... *H01J 37/3002* (2013.01); *C23C 14/3407* (2013.01); *C23C 14/46* (2013.01); *H01J 37/34* (2013.01); *H01J 37/3417* (2013.01); *H01J 37/3435* (2013.01); *H01J 2237/3146* (2013.01)

(58) Field of Classification Search
CPC ............................ C23C 14/46; H01J 37/3417
See application file for complete search history.

(56) References Cited

U.S. PATENT DOCUMENTS

| | | | |
|---|---|---|---|
| 6,224,718 B1* | 5/2001 | Meyer | C23C 14/3407 204/192.11 |
| 6,395,156 B1* | 5/2002 | Hsueh | C23C 14/46 204/192.11 |
| 2002/0053512 A1 | 5/2002 | Grohman et al. | |
| 2012/0080308 A1 | 4/2012 | Kameyama | |

OTHER PUBLICATIONS

European Search Report EP 15 15 8629, corresponding EP application, Jul. 8, 2015.

* cited by examiner

*Primary Examiner* — Jason M Berman
(74) *Attorney, Agent, or Firm* — Wood Herron & Evans LLP

(57) ABSTRACT

In a sputter deposition tool (100) of the type in which an ion source (101) generates a beam directed at a sputtering target, the sputtering target comprises an elongated exterior skirt (102) and a generally circular insert (103) positioned within the skirt, the surfaces of the skirt and insert being relatively coplanar and forming the surface of the target, with the elongated dimension of the skirt being axially oriented toward the ion source. The insert is rotated within the skirt to one of several positions during use of the target by the sputter deposition tool, to distribute wear of the target around the rotating insert and thus increase the utilization and useful life of the overall target assembly.

7 Claims, 13 Drawing Sheets

METHOD FOR INCREASED TARGET UTILIZATION IN ION BEAM DEPOSITION TOOLS

RELATED APPLICATIONS

The present invention claims priority to U.S. Provisional Application Ser. No. 61/951,192 filed Mar. 11, 2014, which is incorporated herein in its entirely.

FIELD OF THE INVENTION

The present invention relates to targets for ion beam deposition.

BACKGROUND OF THE INVENTION

Target materials used in Ion Beam Deposition (IBD) and other like material sputtering process applications can vary from inexpensive materials like Tantalum and Tungsten, to extremely precious metals such as Gold and Platinum. Typically, the percentage of material utilized by the processes before a target change is necessary will depend on the process geometry, beam power parameters, and thickness of the targets. The percentage of utilized material is usually much less than 100% of the target and there is a cost to refining more expensive materials and creating new targets. Furthermore, target replacement causes production line downtime which has a significant cost as well. Increasing the utilization percentage of the target material and the overall target lifetime, while still keeping process geometries and other factors the same is of paramount importance to device makers.

One known approach to improving target life is rotating the target, as is shown in U.S. Patent Publication No. 2012/0080308, in order to even the wear on the target across its surface. A similar concept is to steer the ion beam so that the beam itself moves across the target in a pattern to even the wear on the target. Yet a third concept shown in U.S. Pat. No. 6,755,944, uses a skirted target that has a removable central insert surrounded by an outer region. The insert is removed and replaced when worn while the outer or skirt region remains in place, reducing the amount of waste material generated at changeovers and reducing the material cost of new targets.

SUMMARY OF THE INVENTION

The techniques disclosed herein are a novel way to increase target utilization and target lifetime on sputtering deposition tools. Specifically, a tool using a target with a central insert surrounded by an outer region, incorporates a rotational motion element rotating the target insert. By focusing the ion beam at the target insert at a specified offset distance below the center of rotation of the target, and rotating the target during its use, wear is distributed over the surface of the target insert. In one implementation, the target rotates continuously at a specified number of rotations per minute to achieve the desired effect. In another implementation, the target does not continuously rotate, but rather indexes by a certain number of degrees after each run, allowing a new portion of the target surface to be utilized in the next process.

Specifically, in one embodiment, the invention features a sputter deposition tool, comprising an ion source generating a beam directed at a sputtering target, the target having a generally planar surface which is angled away from the ion source. The sputtering target comprises an elongated exterior skirt and a generally circular insert positioned within the skirt, the surfaces of the skirt and insert being relatively coplanar and forming the surface of the target, the elongated dimension of the skirt being axially oriented toward the ion source. The insert is rotated within the skirt to one of several positions during use of the target by the sputter deposition tool.

In one embodiment, the target insert rotates during use of the sputter deposition tool. The rotation may be continuous or in an indexed, stepped manner during use of the sputter deposition tool. Alternatively, or in addition, the target insert may rotates in an indexed manner during pauses in use of the sputter deposition tool.

This Summary is provided to introduce an election of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF THE INVENTION

Figure 1:
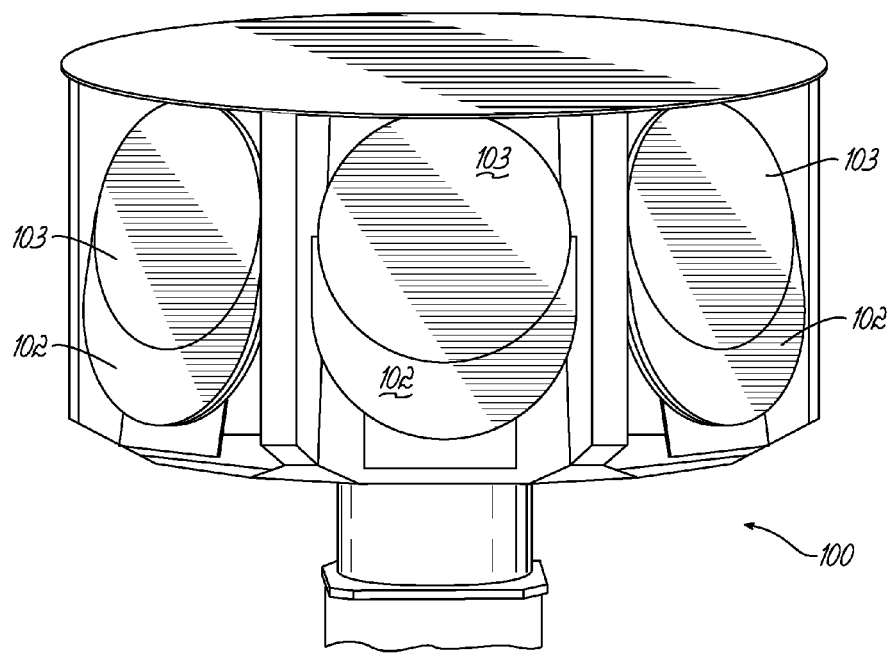
FIG. 1 is a perspective view of a sputtering tool carrying a plurality of sputtering targets configured in accordance with the present invention.

FIG. 1 illustrates a typical environment of use for the present invention, specifically, a target holder in an ion beam deposition chamber 100 carries a number of elongated targets, each comprising a generally circular rotating insert 103 and a skirt 102, positioned for bombardment by an ion source to sputter target material upon a substrate.

Figure 2:
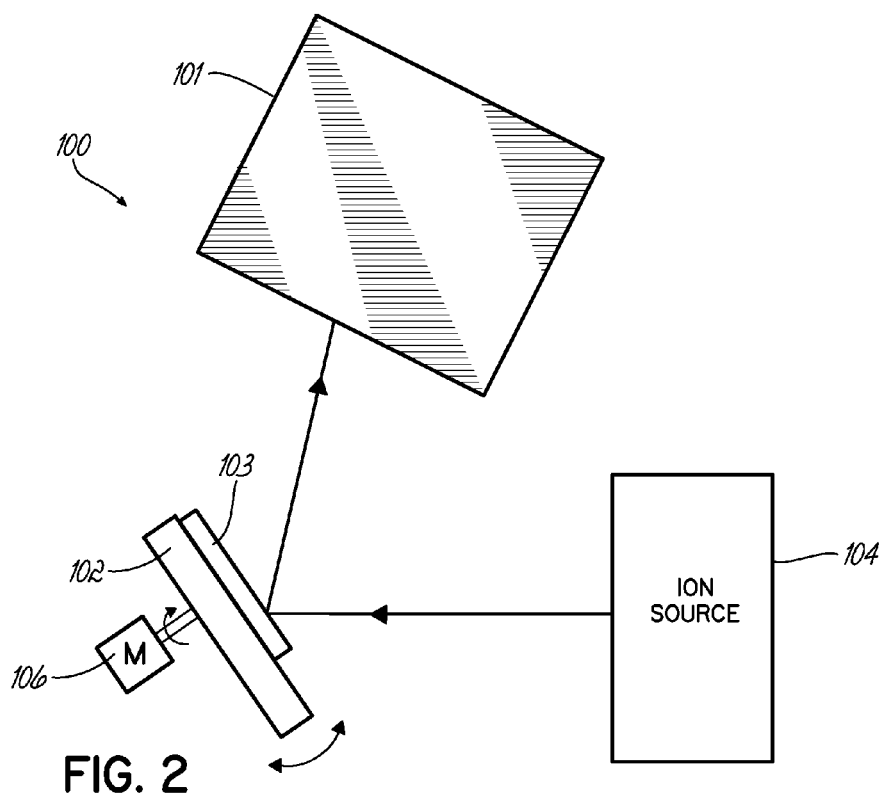
FIG. 2 illustrates an example of the target and process geometries inside an ion beam deposition chamber 100.

FIG. 2 illustrates an example of the target and process geometries in an ion beam deposition chamber 100. In its simplest terms, the ion source 104 shoots a beam of ions at a target 103 of a given material, which is connected to a water cooled backing plate 102. The target 103 can be angularly displaced a certain number of degrees to direct the plume of target material in a different direction. Due to the force imparted on the target 103, material is sputtered off of the target 103 and onto the substrate 101. A normal ion beam deposition chamber 100 has multiple selectable targets 103.

Figure 3:
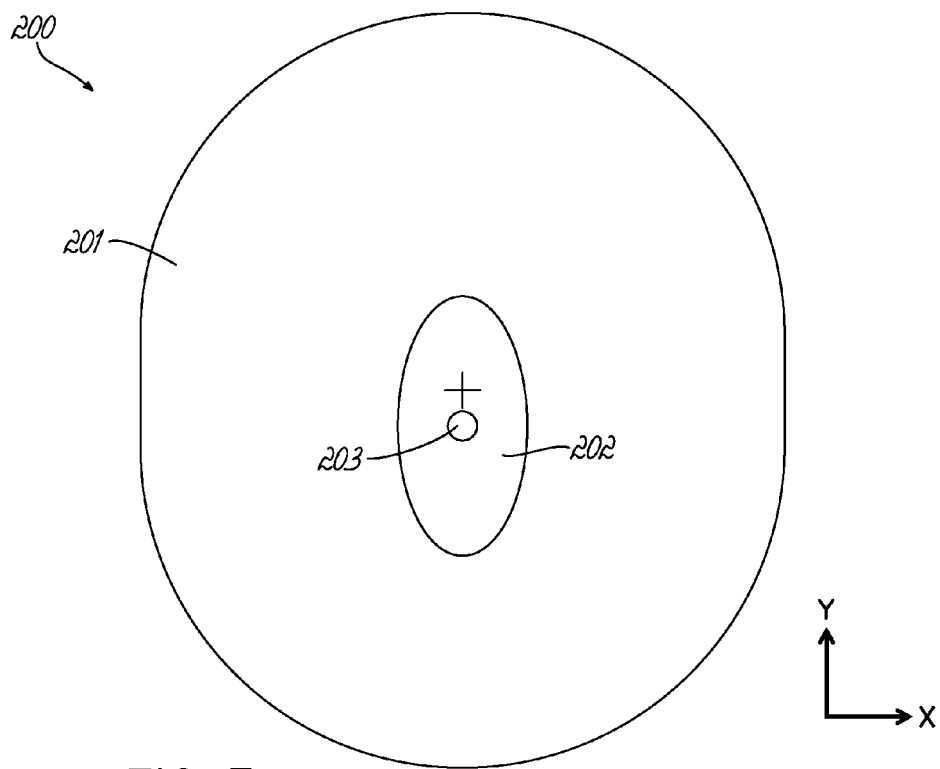
FIG. 3 illustrates an example of target utilization in a normal deposition target 200.

FIG. 3 illustrates an example of target utilization in a target 200 that is typical of the prior art. The ion source's beam is centered on a particular spot (known as the "beam center 203"). The erosion profile 202 is almost entirely confined into an ellipse that is centered on the beam center 203. After some time, the target surface 201 will be eroded to the point which it can no longer be used, and is replaced.

Figure 4:
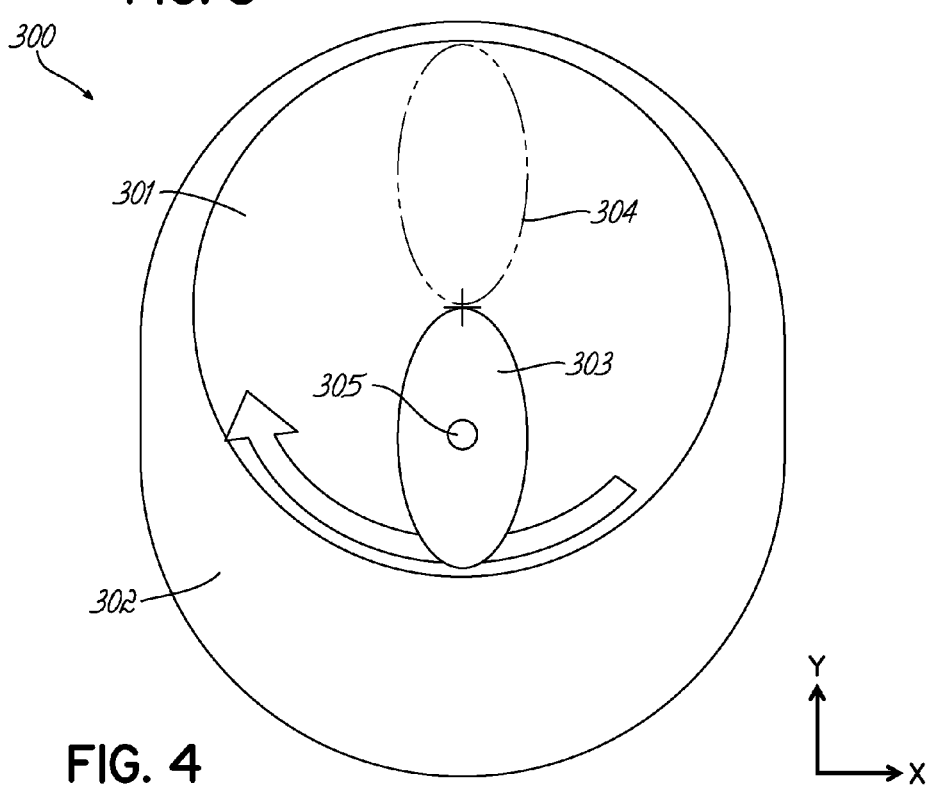
FIG. 4 illustrates an example of target utilization increase using a rotating target insert.

FIG. 4 illustrates an example of improved target utilization 300 using a rotating target insert 301. The beam center 305 is located towards the bottom of the rotating target insert 301; therefore, the erosion profile 303 is centered towards the bottom of the rotating target insert 301 and is almost completely located within an ellipse created by the beam. There is a target skirt 302 located around the rotating target insert 301 that may be made of the same material as the rotating target insert 301, or of a different material. The skirt 302 serves to eliminate beam overspray and cross-contamination. In one implementation, during operation a motor such as shown at 106 in FIG. 2 coupled to the rotating target insert 201 rotates at a specified number of rotations per minute continuously to achieve the desires increased utilization effect. Alternatively, the rotating target insert 201 may rotate in a discontinuous, indexed fashion during operation. In another implementation, the rotating target insert 301 is stationary during the process, and once the process is completed, the rotating target insert 301 indexes to a different angular position, so that a different part of the target surface can be used.

In one implementation the target skirt has a dimension of approximately 12 by 14 inches and the target insert has a diameter of about 12 inches. In a second implementation for a smaller beam size, the target skirt has a dimension of approximately 9 by 12 inches and the target insert has a diameter of about 9 inches.

This inventive system has an advantage over known rotating target tools in that the target wear is controlled to the area of the target insert which can be replaced more readily and with less expense than the entire target. The inventive system has an advantage over known tools using a target insert in that the wear is distributed across the target insert by the rotation of the insert. Finally, the inventive system has an advantage over beam steering tools in that it avoids the complexity of beam steering, which can be particularly difficult in large-target applications where there is a long distance between the source and target; long distances are common when sputtering conductive materials in order to avoid coating the source with conductive material which slows the process and eventually requires cleaning of the source.

The wear on the target after rotation is shown by the anticipated ancillary erosion profile 304, which is positioned at multiple selectable locations across the surface of the rotating target insert 301 as the target insert is rotated. The target may thus be used with a tilt to a desired angle in the y-direction, while maintaining a relatively even wear of the target insert.

Figure 5A:
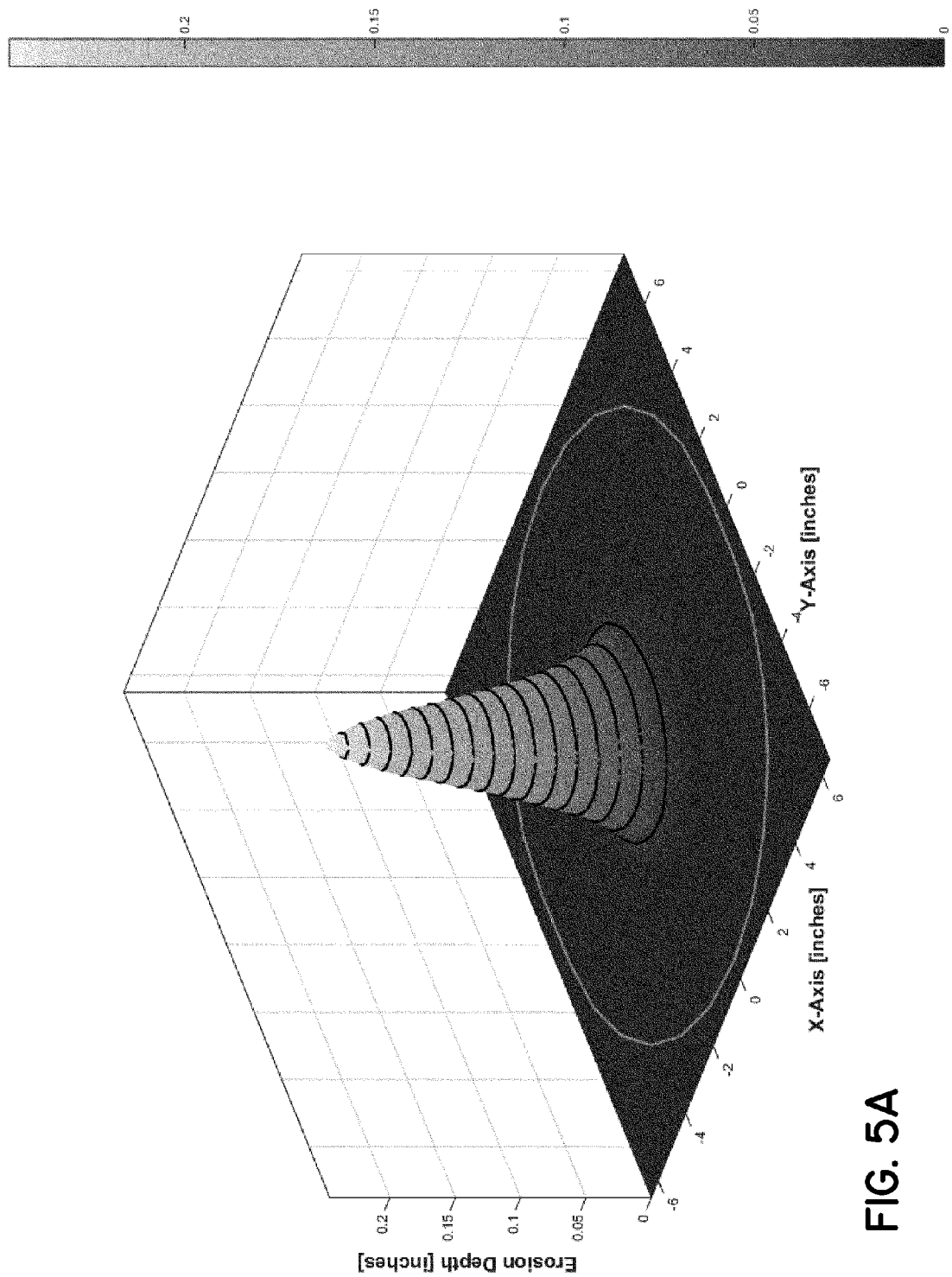
FIG. 5A is a perspective view of the erosion profile measured on a static elongated target in the sputter deposition tool of FIG. 1.
Figure 5B:
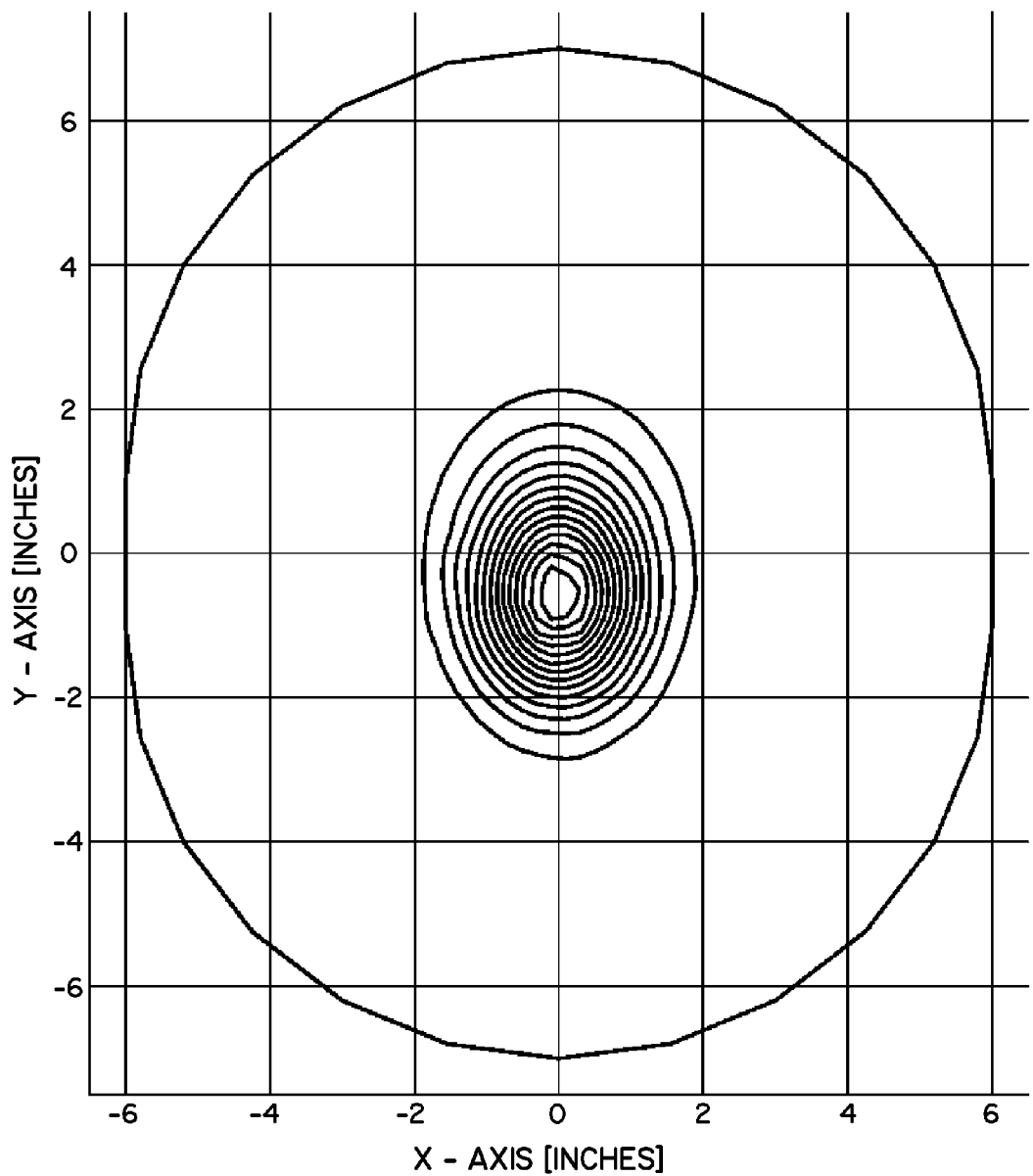
FIG. 5B is a elevation map of this erosion profile.

FIGS. 5A and 5B illustrate a measured erosion profile for a static elongated target, in three dimensional elevation and contour map form. This measured erosion profile shows how wear is concentrated at the center point of the ion beam when the target is static. This erosion profile shows a target that has reached the end of its useful life, which occurs when there is 0.25 inches of erosion into the target, which is considered sufficient to necessitate target replacement. As can be seen, only a small volume of the target has been utilized and the erosion is limited to a small area of the target when the target is static. This erosion profile may be used to simulate the erosion of a rotating target insert, by simulating the distribution of the erosion radially around a simulated rotating insert, to thus evaluate the increase in target life when using a rotating insert, as compared to a static target.

Figure 6A:
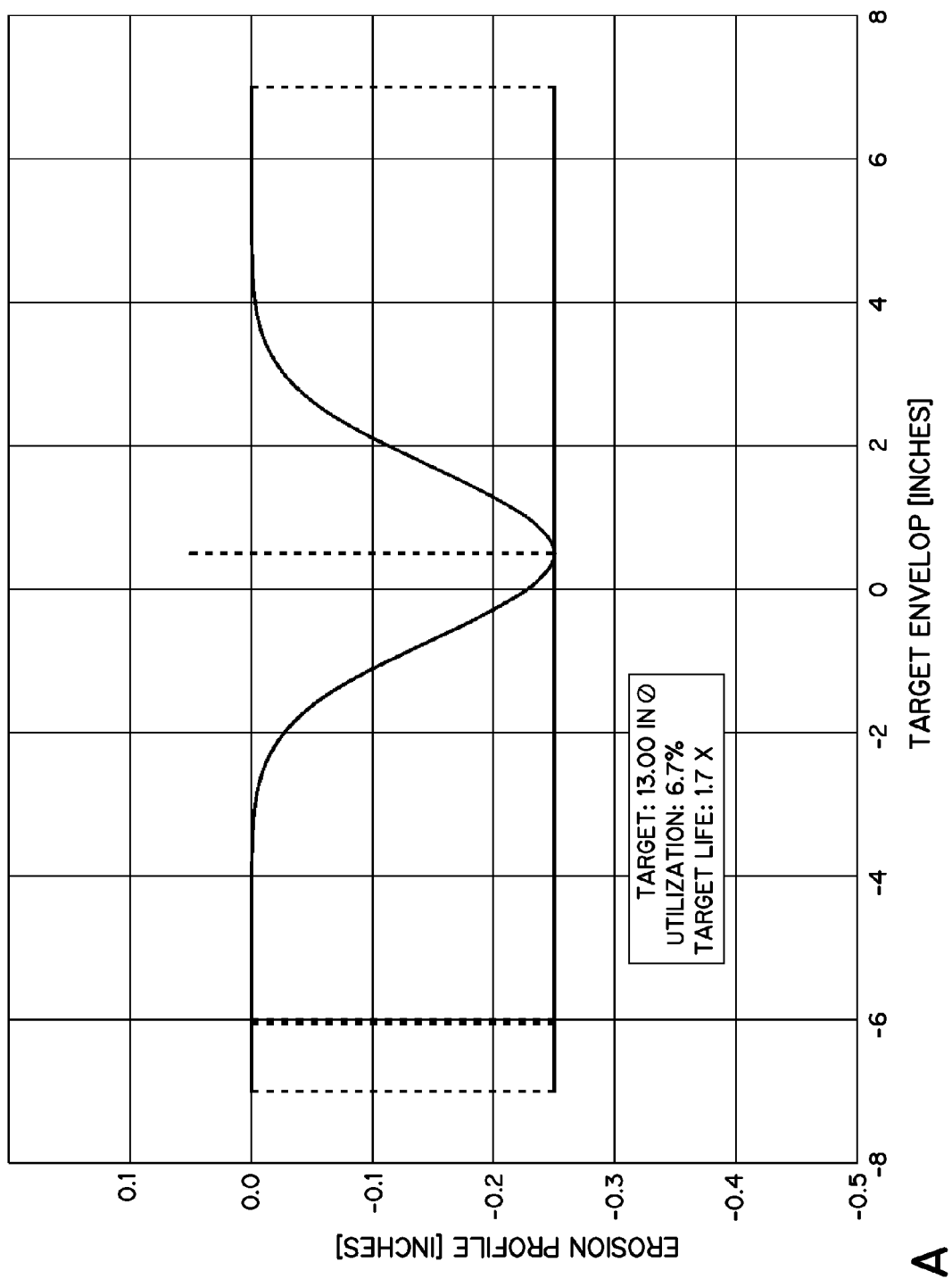
FIG. 6A is a diagram of the simulated erosion of an elongated target having a rotating insert and skirt in accordance with the present invention, in which the center of the rotating insert is offset from the center of the elongated target by 0.5 inch.

FIGS. 6A-6G illustrate the wear patterns of a simulated rotating target insert and static target skirt of various dimensions. In FIG. 6A the rotating target insert is offset 0.5 inch from the center of the elongated target and has a diameter of 13 inches, in this configuration the rotating insert is 6.7% utilized when the erosion depth reaches the 0.25 inch threshold for replacement. This level of wear occurs after a useful life which is 1.7 times longer than the useful life of a static target.

Figure 6B:
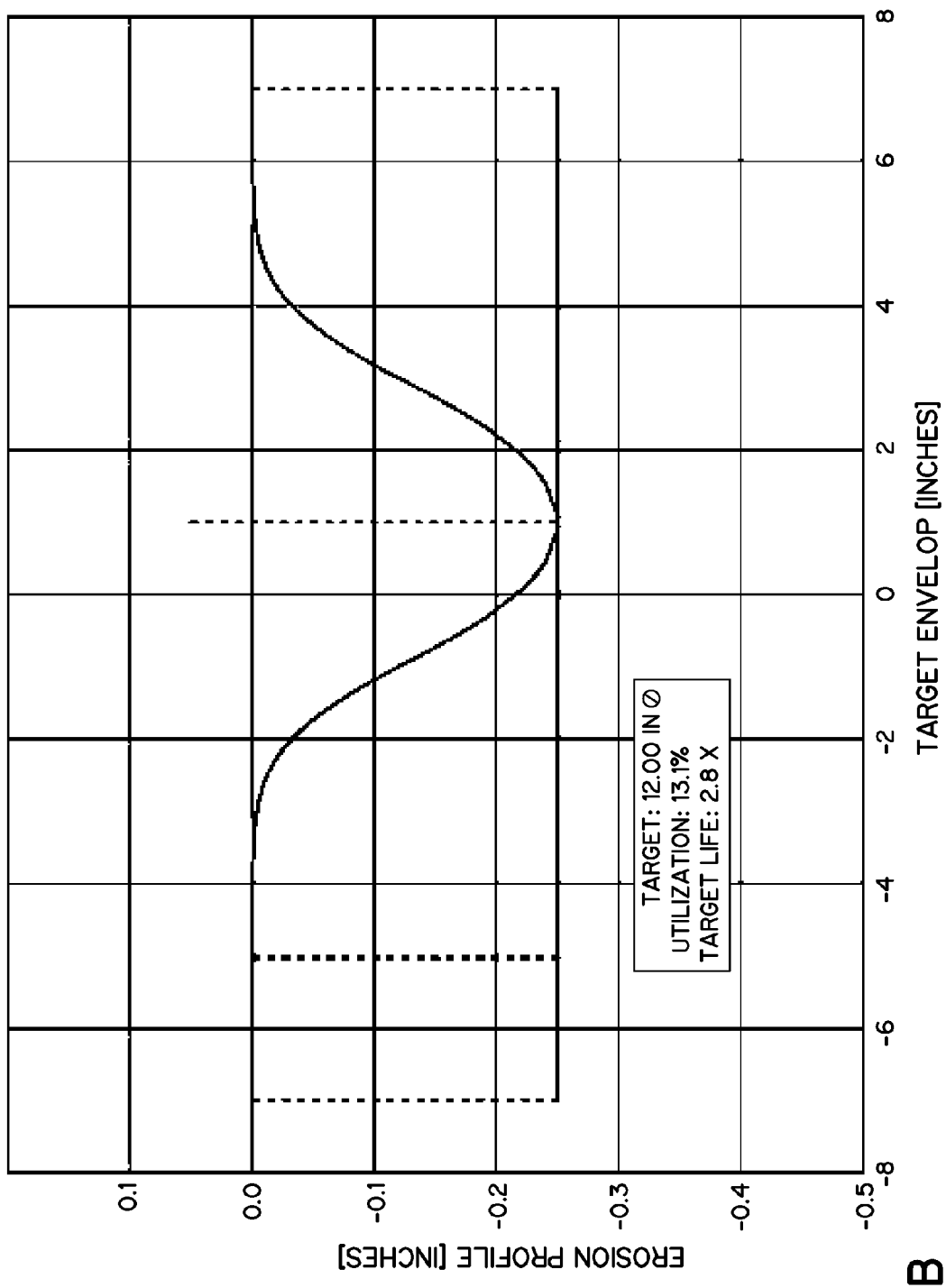
FIG. 6B is a diagram of the simulated erosion of an elongated target and rotating insert in which the center of the rotating insert is offset from the center of the elongated target by 1.0 inch.

In FIG. 6B the rotating target insert is offset 1.0 inch from the center of the elongated target and has a diameter of 12 inches, in this configuration the rotating insert is 13.1% utilized when the erosion depth reaches the 0.25 inch threshold for replacement. This level of wear occurs after a useful life which is 2.8 times longer than the useful life of a static target.

Figure 6C:
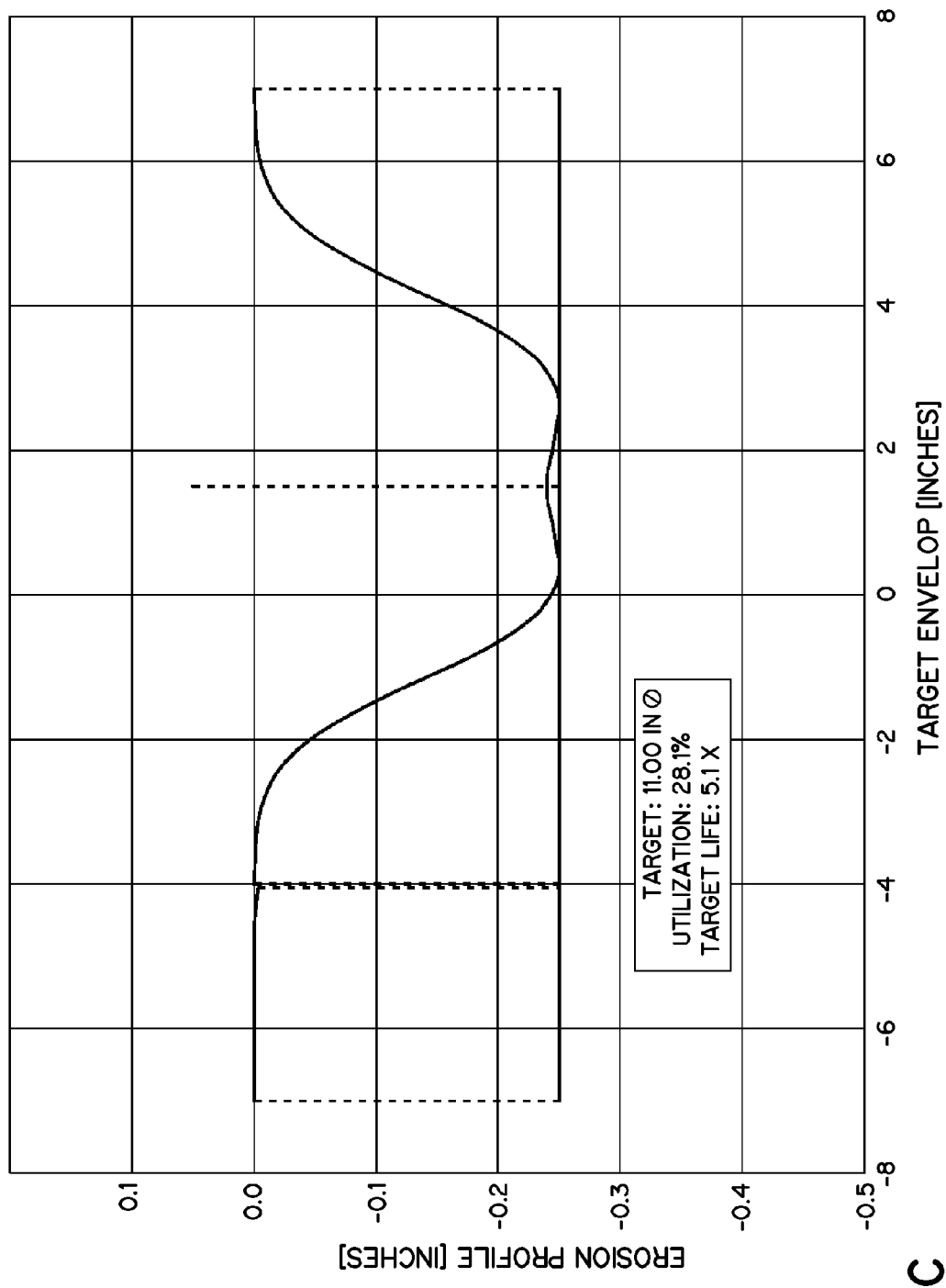
FIG. 6C is a diagram of the simulated erosion of an elongated target and rotating insert in which the center of the rotating insert is offset from the center of the elongated target by 1.5 inch.

In FIG. 6C the rotating target insert is offset 1.5 inch from the center of the elongated target and has a diameter of 11 inches, in this configuration the rotating insert is 28.1% utilized when the erosion depth reaches the 0.25 inch threshold for replacement. This level of wear occurs after a useful life which is 5.1 times longer than the useful life of a static target. It will be noted in FIG. 6C that a small, but noticeable, level of erosion accumulates on the static skirt at the point that the target has reached the end of its useful life. When skirt erosion reaches the 0.25 inch threshold the skirt will require replacement.

Figure 6D:
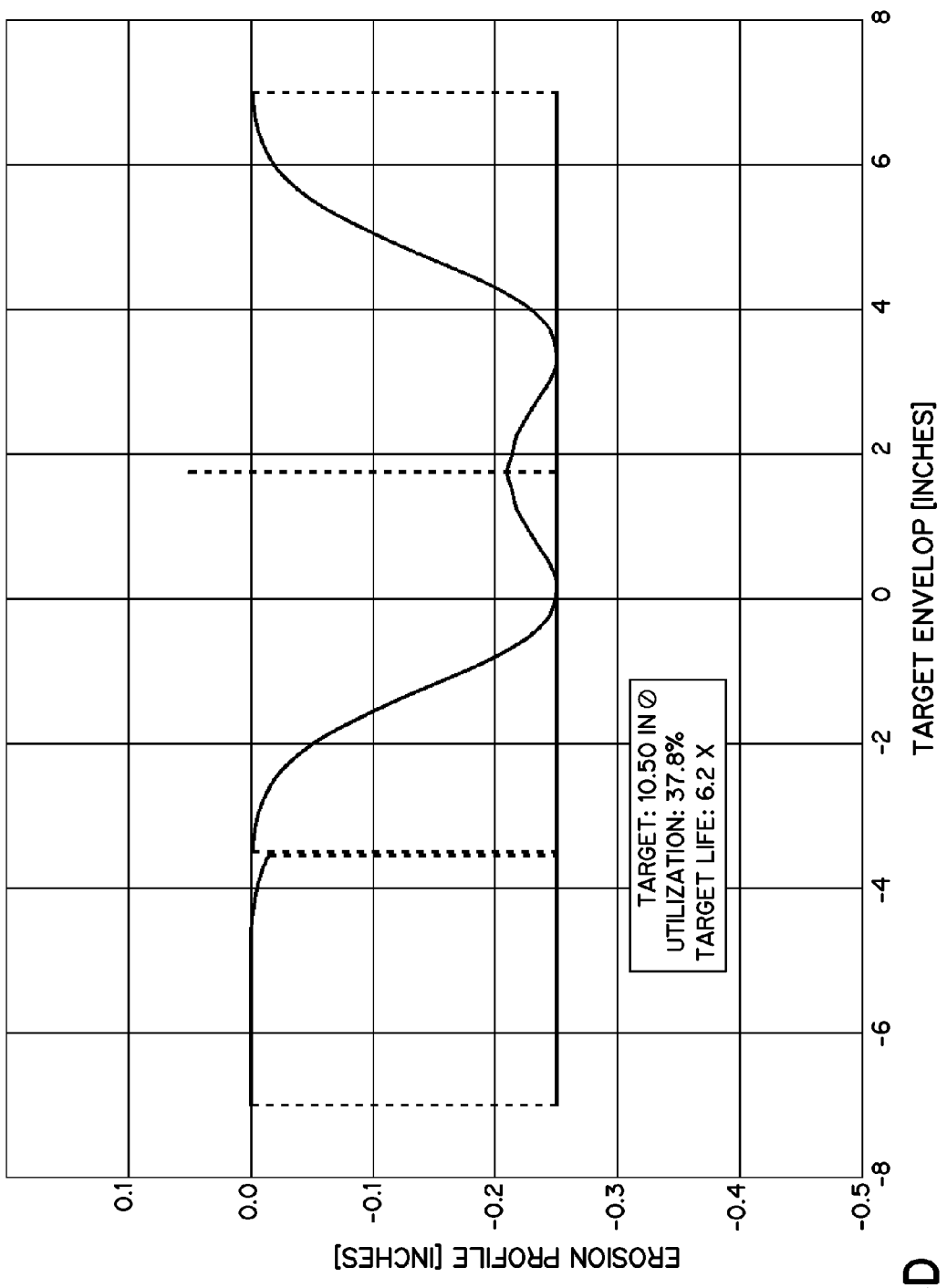
FIG. 6D is a diagram of the simulated erosion of an elongated target and rotating insert in which the center of the rotating insert is offset from the center of the elongated target by 1.75 inch.

In FIG. 6D the rotating target insert is offset 1.75 inch from the center of the elongated target and has a diameter of 10.5 inches, in this configuration the rotating insert is 37.8% utilized when the erosion depth reaches the 0.25 inch threshold for replacement. This level of wear occurs after a useful life which is 6.2 times longer than the useful life of a static target. The skirt wear is more pronounced in this embodiment, indicating that a skirt replacement will likely be required after approximately 10-15 insert replacements.

Figure 6E:
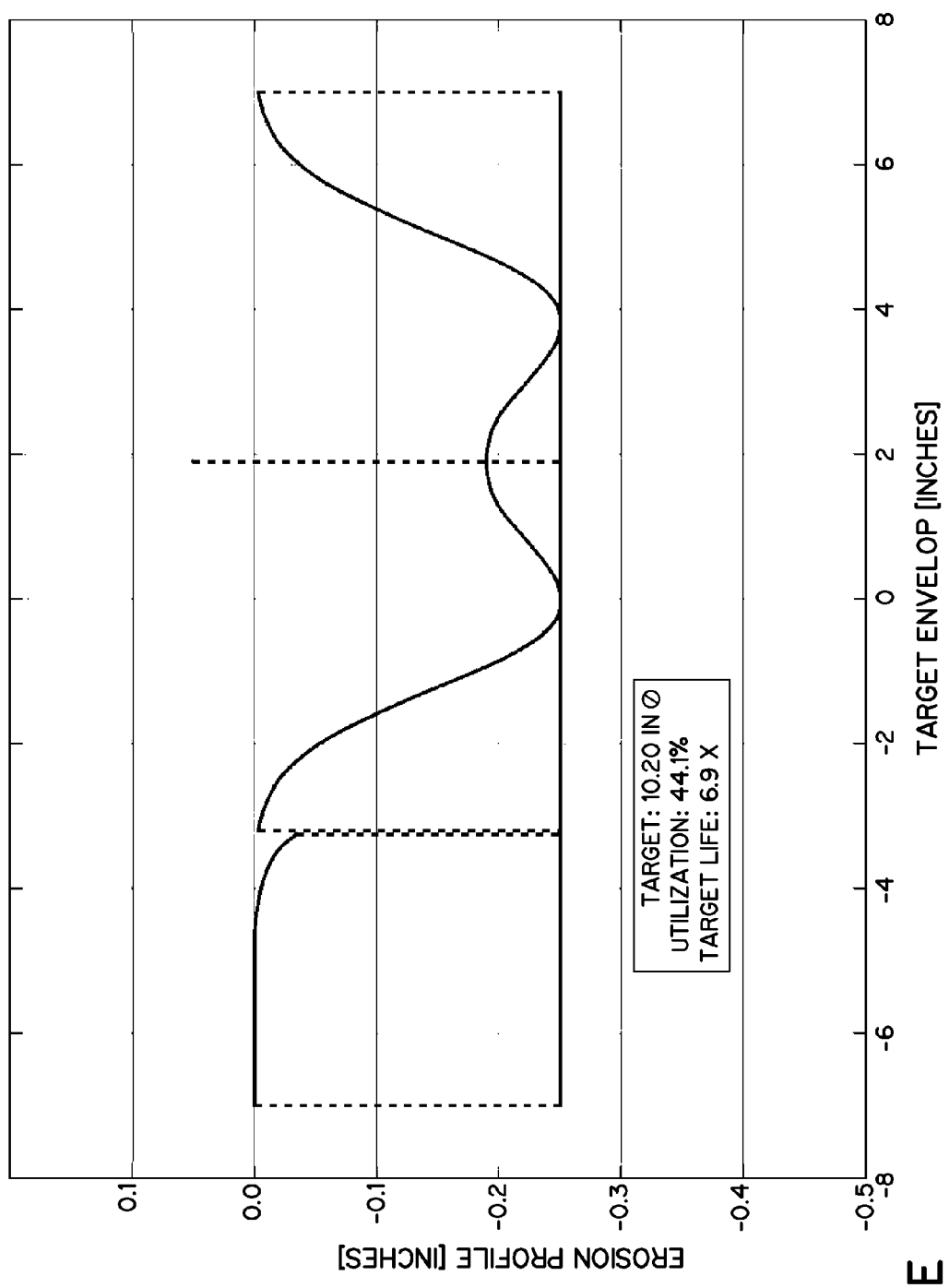
FIG. 6E is a diagram of the simulated erosion of an elongated target and rotating insert in which the center of the rotating insert is offset from the center of the elongated target by 1.9 inch.

In FIG. 6E the rotating target insert is offset 1.9 inch from the center of the elongated target and has a diameter of 10.2 inches, in this configuration the rotating insert is 44.1% utilized when the erosion depth reaches the 0.25 inch threshold for replacement. This level of wear occurs after a useful life which is 6.9 times longer than the useful life of a static target. Skirt replacement is likely necessitated after 4-5 insert replacements.

Figure 6F:
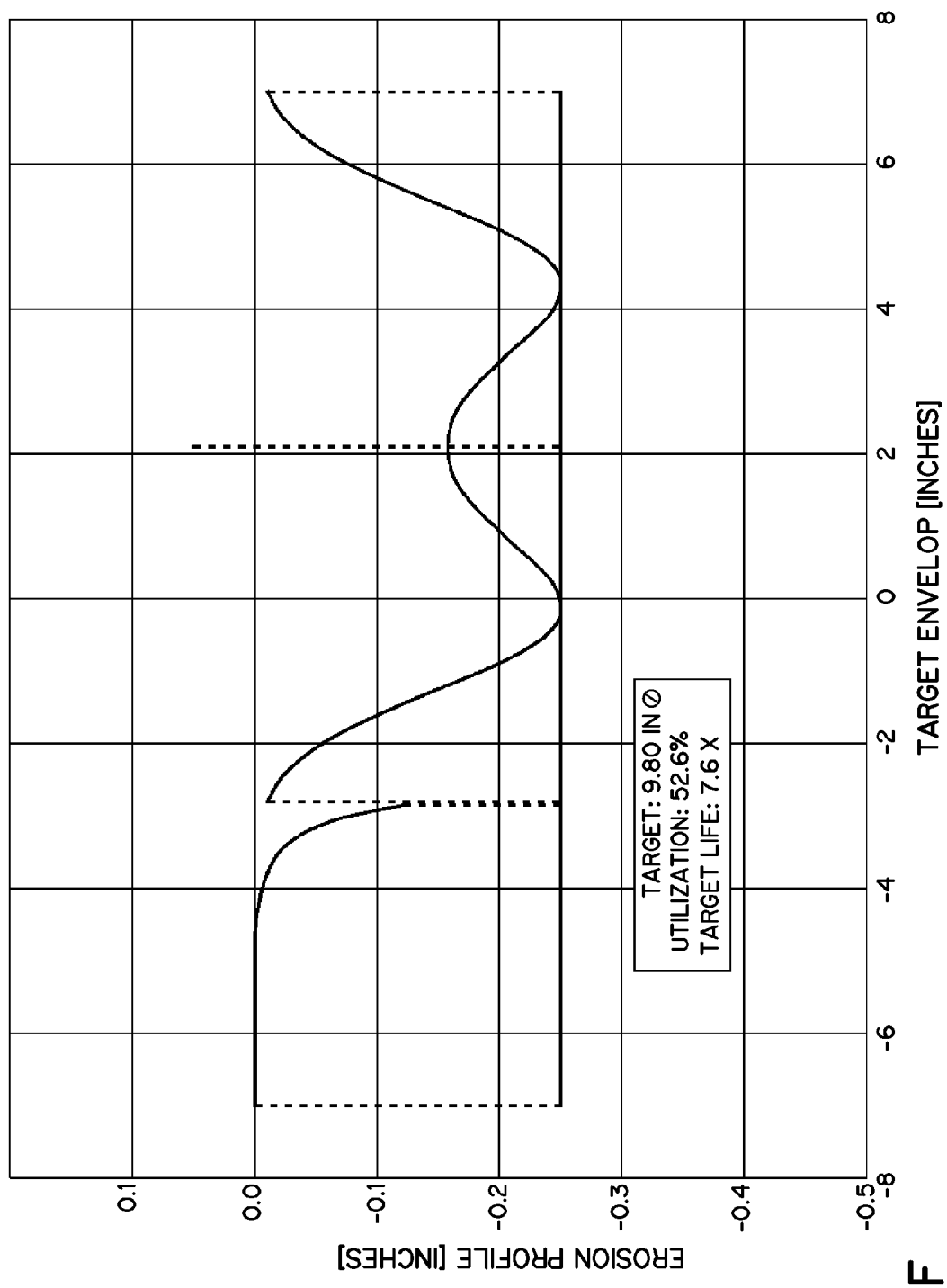
FIG. 6F is a diagram of the simulated erosion of an elongated target and rotating insert in which the center of the rotating insert is offset from the center of the elongated target by 2.1 inch.

In FIG. 6F the rotating target insert is offset 2.1 inch from the center of the elongated target and has a diameter of 9.8 inches, in this configuration the rotating insert is 52.6% utilized when the erosion depth reaches the 0.25 inch threshold for replacement. This level of wear occurs after a useful life which is 7.6 times longer than the useful life of a static target. Skirt replacement is required after no more than 2 insert replacements.

Figure 6G:
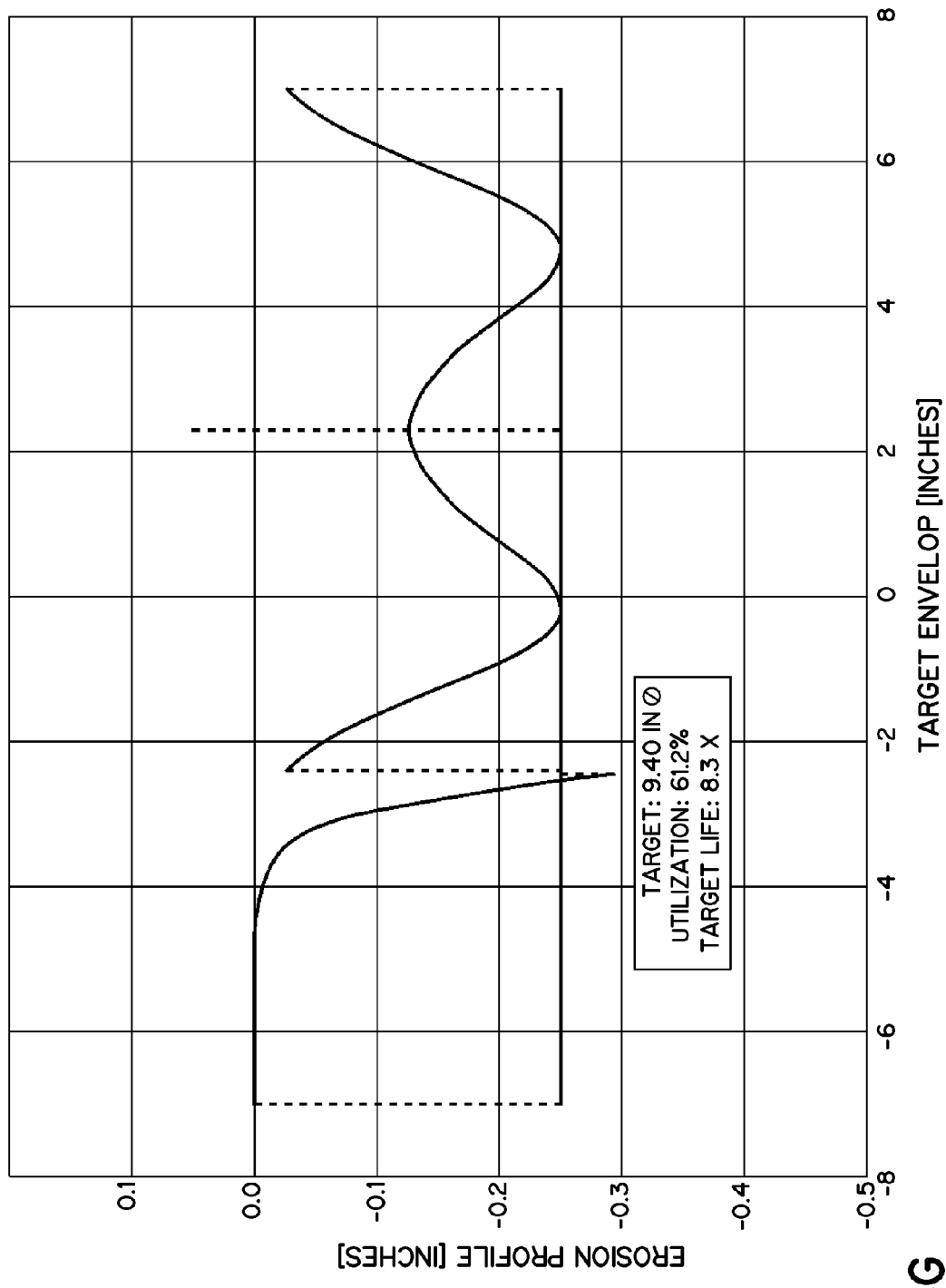
FIG. 6G is a diagram of the simulated erosion of an elongated target and rotating insert in which the center of the rotating insert is offset from the center of the elongated target by 2.3 inch.

In FIG. 6G the rotating target insert is offset 2.3 inch from the center of the elongated target and has a diameter of 9.4 inches, in this configuration the rotating insert is 61.2% utilized when the erosion depth of the rotating insert reaches the 0.25 inch threshold for replacement. This level of wear occurs after a useful life which is 8.3 times longer than the useful life of a static target. However, the skirt erosion exceeds the 0.25 inch threshold for replacement at approximately the same time as the rotating insert.

Figure 7A:
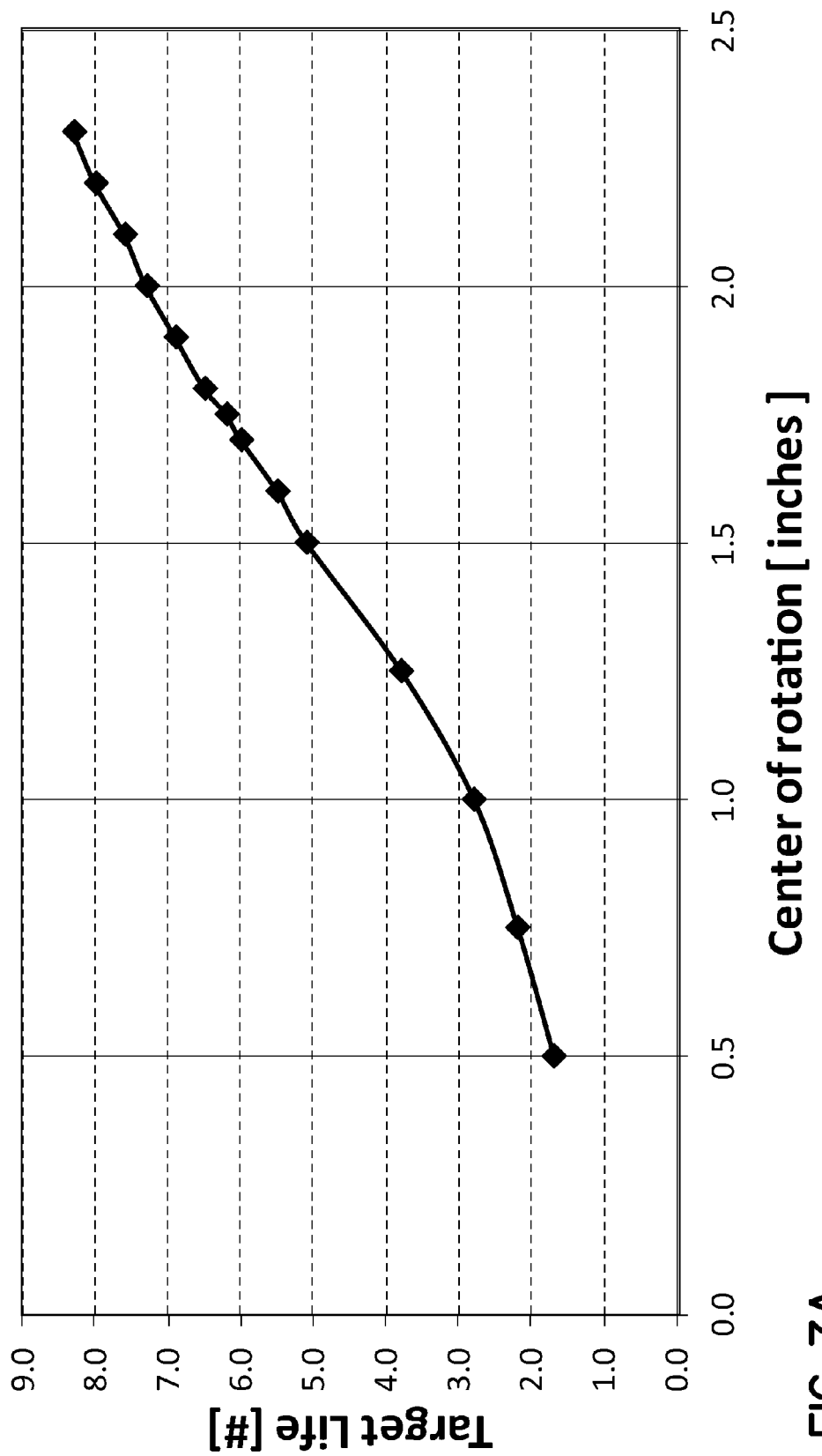
FIG. 7A is a chart illustrating the increase in target life accomplished by the present invention as compared to a static target, for various selections of target insert size.
Figure 7B:
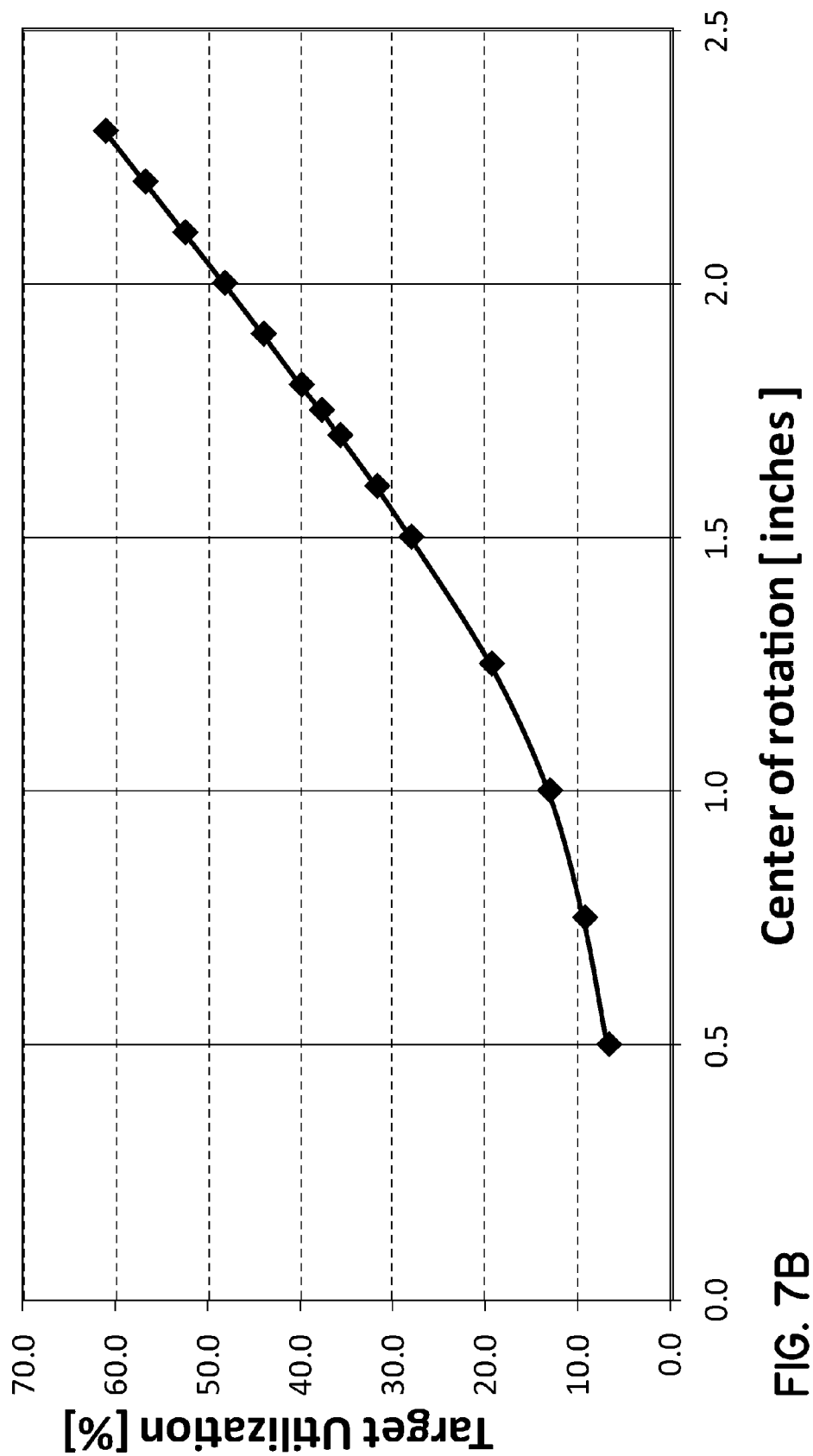
FIG. 7B is a chart illustrating the percentage increase in target life accomplished by the present invention as compared to a static target, for various selections of target insert size.

FIGS. 7A and 7B illustrate the increased target life and increase in target utilization for various simulated target insert sizes, as identified by the offset of the center of the rotating insert from the center of the elongated target. It can be seen that the target insert life and utilization increase monotonically as the target is made smaller and further offset from the center of the elongated target structure; however, the requirement for skirt replacement must be factored in the final decision of target insert dimensions, so that the combined cost of target insert replacement and intermittent target skirt replacement are collectively minimized. It is presently believed that this minimization is accomplished with a target insert and skirt size relationship such as that seen in FIG. 6E.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. An ion beam sputter deposition tool, comprising
   a. an ion source generating a beam for direction to a sputtering target;
   b. a sputtering target positioned for bombardment by the ion source having a generally planar surface, wherein the sputtering target comprises an exterior skirt and an insert positioned within the skirt, the surfaces of the skirt and insert being relatively coplanar and forming the generally planar surface of the target, and
   c. a motorized means for rotating the insert within the skirt on an axis perpendicular to the generally planar surface of the target, to one of several positions during use of the target by the sputter deposition tool.

2. The tool of claim 1 wherein the target insert rotates continuously during use of the sputter deposition tool.

3. The tool of claim 1 wherein the target insert rotates discontinuously during use of the sputter deposition tool.

4. The tool of claim 1 wherein the target insert rotates in an indexed manner during pauses in use of the sputter deposition tool.

5. The tool of claim 1 wherein the generally planar surface of the sputtering target is angled away from the ion source.

6. The tool of claim 1 wherein the skirt has an elongated dimension.

7. The tool of claim 6 wherein the elongated dimension of the skirt is axially oriented toward the ion source.

* * * * *